US011300607B2

(12) United States Patent
Boe

(10) Patent No.: US 11,300,607 B2
(45) Date of Patent: Apr. 12, 2022

(54) METHOD FOR DETECTING AN OPEN CIRCUIT STATE IN A PIEZOELECTRIC ELEMENT CONNECTION

(71) Applicant: TE Connectivity Norge AS, Blomesterdalen (NO)

(72) Inventor: Hakon Boe, Blomsterdalen (NO)

(73) Assignee: TE CONNECTIVITY NORGE AS, Blomsterdalen (NO)

( * ) Notice: Subject to any disclaimer, the term of this patent is extended or adjusted under 35 U.S.C. 154(b) by 0 days.

(21) Appl. No.: 17/205,527

(22) Filed: Mar. 18, 2021

(65) Prior Publication Data

US 2021/0208192 A1 Jul. 8, 2021

Related U.S. Application Data

(63) Continuation of application No. PCT/EP2019/075202, filed on Sep. 19, 2019.

(30) Foreign Application Priority Data

Sep. 21, 2018 (EP) ..................................... 18195891

(51) Int. Cl.
*G01R 31/00* (2006.01)
*G01R 31/28* (2006.01)

(52) U.S. Cl.
CPC ..... *G01R 31/2829* (2013.01); *G01R 31/2839* (2013.01)

(58) Field of Classification Search
CPC ............ G01R 31/2829; G01R 31/2839; G01R 31/54; G01R 23/02; G01R 29/22; H01L 41/042
See application file for complete search history.

(56) References Cited

U.S. PATENT DOCUMENTS

| 5,220,836 A * | 6/1993 | Harms ....................... G01L 1/16 310/338 |
| 5,376,854 A | 12/1994 | Oouchi |
| 6,639,411 B1 | 10/2003 | Thomsen |
| 6,870,377 B2 | 3/2005 | Thomsen |
| 2001/0039484 A1 | 11/2001 | Freudenberg et al. |
| 2002/0011804 A1* | 1/2002 | Fujimura ........... H05B 41/2855 315/291 |

(Continued)

FOREIGN PATENT DOCUMENTS

| CN | 105675960 A | 6/2016 |
| DE | 10325446 B3 | 3/2005 |

(Continued)

OTHER PUBLICATIONS

International Search Report, dated Dec. 16, 2019, 3 pages.
Abstract of DE 10325446, dated Mar. 3, 2005, 2 pages.
Abstract of CN 105675960, dated Jun. 15, 2016, 1 page.

*Primary Examiner* — Thang X Le

(57) ABSTRACT

A method for detecting an open circuit state failure in a piezoelectric element connection includes exciting a piezoelectric element with an excitation signal and monitoring and evaluating an electrical output signal generated by the piezoelectric element in response to the excitation signal. The excitation signal is a pulse train. A frequency of the pulse train is chosen such that the piezoelectric element acts as a low pass filter.

16 Claims, 5 Drawing Sheets

(56) References Cited

U.S. PATENT DOCUMENTS

2008/0092675 A1* 4/2008 Komine ............ G01C 19/5607
                                                          74/5.4
2010/0088067 A1* 4/2010 Jensen ................ G01H 11/08
                                                          702/182
2011/0140685 A1   6/2011 Zu et al.

FOREIGN PATENT DOCUMENTS

EP    2048343 A1    4/2009
WO    2014074290 A1    5/2014

* cited by examiner

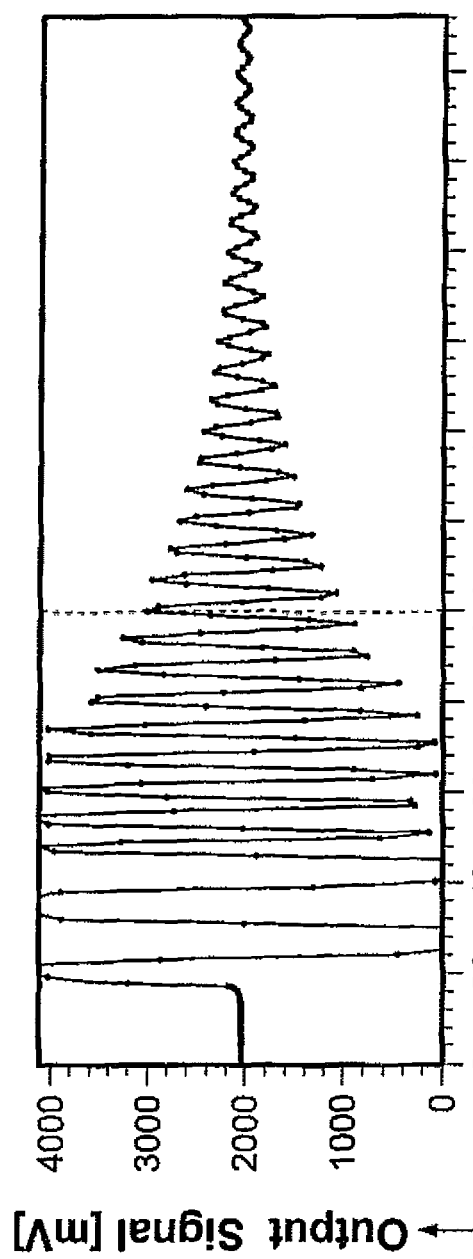
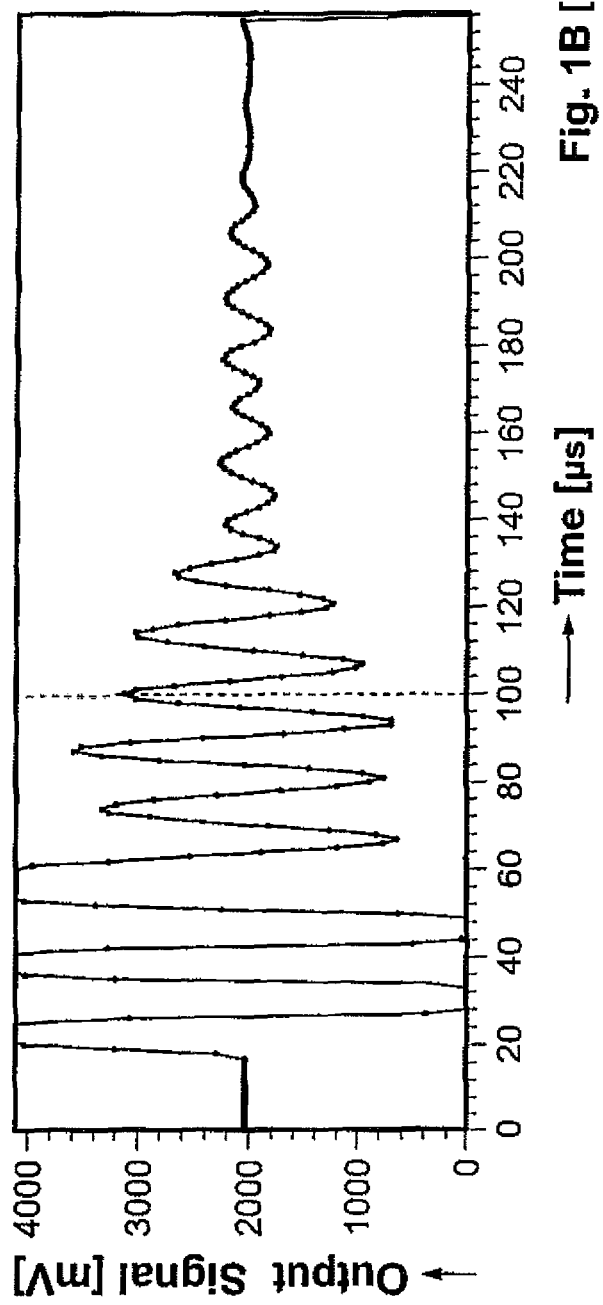

METHOD FOR DETECTING AN OPEN CIRCUIT STATE IN A PIEZOELECTRIC ELEMENT CONNECTION

CROSS-REFERENCE TO RELATED APPLICATIONS

This application is a continuation of PCT International Application No. PCT/EP2019/075202, filed on Sep. 19, 2019, which claims priority under 35 U.S.C. § 119 to European Patent Application No. 18195891.9, filed on Sep. 21, 2018.

FIELD OF THE INVENTION

The present invention relates to a piezoelectric element and, more particularly, to failure detection in a piezoelectric element.

BACKGROUND

In a piezoelectric apparatus, failures such as an open circuit state can occur. To avoid further damage of the apparatus, a malfunction in the piezoelectric element must be detected quickly. To that end, devices for detecting a failure in a piezoelectric apparatus have been suggested (see e.g. U.S. Pat. No. 5,376,854, CN 105675960 A).

Previous methods for detecting a failure in a piezoelectric apparatus include exciting the piezoelectric element at its natural resonant frequency, monitoring the voltage generated by the piezoelectric element, and evaluating the recorded voltage signal, as this is for instance shown in U.S. Pat. No. 6,639,411 B1 or U.S. Pat. No. 6,870,377 B2. The recorded signal is then compared to a prototype signal, which has been recorded with a properly functioning piezoelectric element using a similar input. Thereby, the comparison of the two signals relies upon analyzing the ringdown of the excitation with a frequency at the transducer's resonance frequency.

FIGS. 1A and 1B show an example of a voltage signal recorded either with an open circuit (i.e. malfunctioning) piezoelectric element in FIG. 1A or with a not open circuit (i.e. functioning) piezoelectric element shown in FIG. 1B according to a conventional testing method. However, such known methods used for open circuit detection are prone to produce false positives and therefore are not very robust. False detections of open circuits will lead to well-functioning sensors being replaced.

SUMMARY

A method for detecting an open circuit state failure in a piezoelectric element connection includes exciting a piezoelectric element with an excitation signal and monitoring and evaluating an electrical output signal generated by the piezoelectric element in response to the excitation signal. The excitation signal is a pulse train. A frequency of the pulse train is chosen such that the piezoelectric element acts as a low pass filter.

BRIEF DESCRIPTION OF THE DRAWINGS

The invention will now be described by way of example with reference to the accompanying Figures, of which:

FIG. 1A is a graph of a recorded voltage signal with an open circuit piezoelectric element according to the prior art;

FIG. 1B is a graph of a recorded voltage signal with a not open circuit piezoelectric element according to the prior art;

DETAILED DESCRIPTION OF THE EMBODIMENT(S)

The accompanying drawings are incorporated into and form a part of the specification to illustrate several embodiments of the present invention. These drawings together with the description serve to explain the principles of the invention. The drawings are merely for the purpose of illustrating examples of how the invention can be made and used, and are not to be construed as limiting the invention to only the illustrated and described embodiments. Furthermore, several aspects of the embodiments may form—individually or in different combinations—solutions according to the present invention. Further features and advantages will become apparent from the following more particular description of the various embodiments of the invention, as illustrated in the accompanying drawings, in which like references refer to like elements. The following embodiments do not limit the scope of the claims.

Figure 2A:
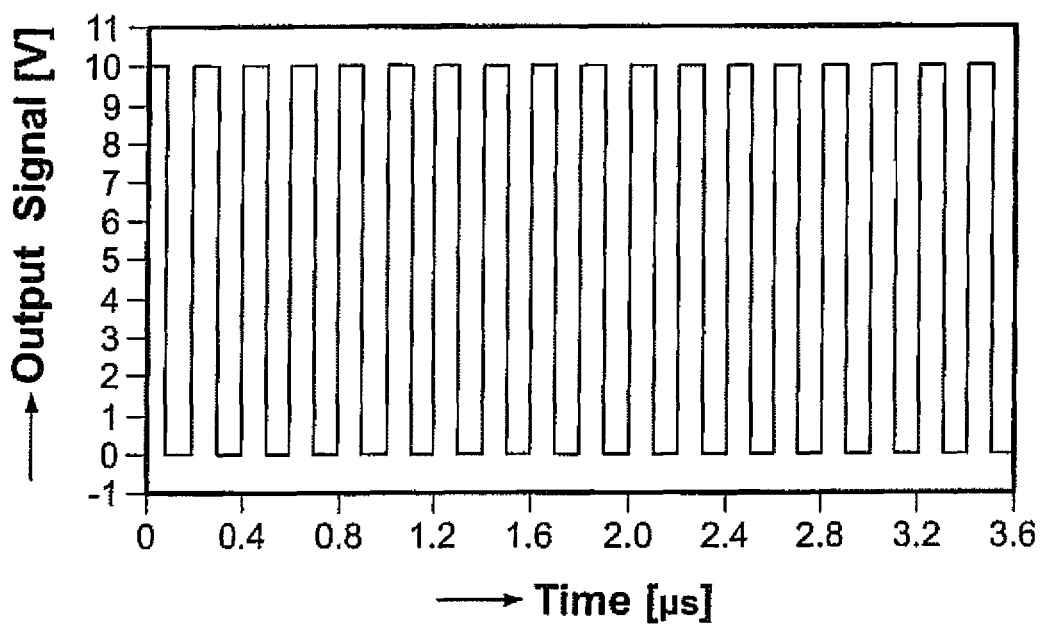
FIG. 2A is a graph of a recorded voltage signal according to an embodiment with an open circuit piezoelectric apparatus.
Figure 2B:
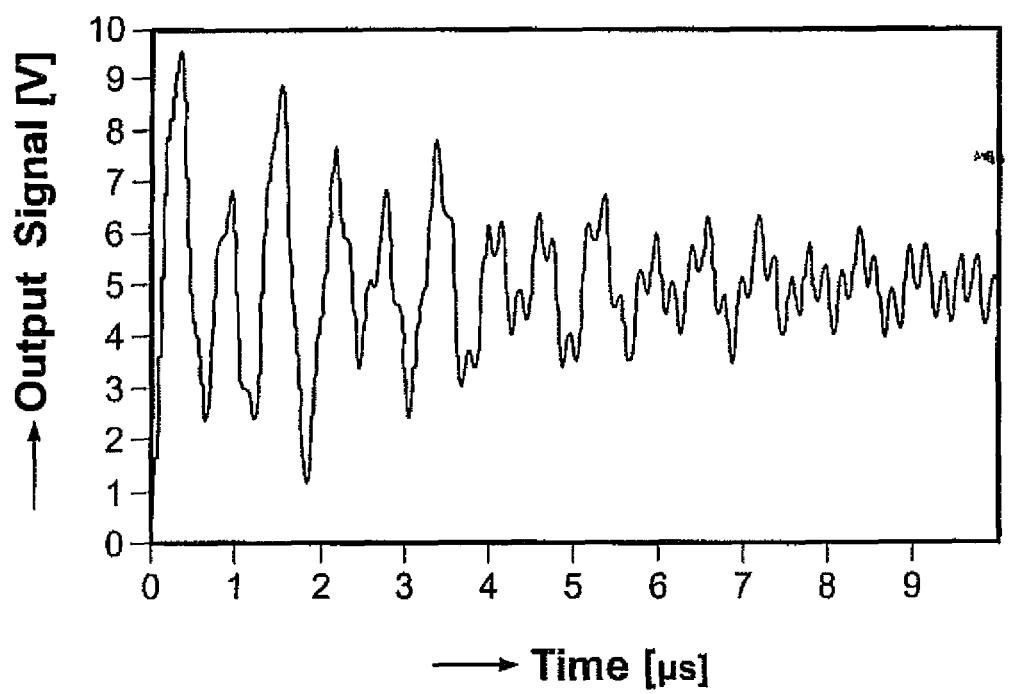
FIG. 2B is a graph of a recorded voltage signal according to an embodiment with a not open circuit piezoelectric apparatus.

As shown in FIGS. 2A and 2B, the voltage signals in the present invention can be distinguished easily and robustly as compared to previous methods shown in FIGS. 1A and 1B. When there is an open circuit, the piezoelectric element has no influence on the signal recorded during excitation, as shown in FIG. 2A. Therefore, the recorded signal equals the original pulse train used to excite the piezoelectric element. This means that the samples can take two values only, namely either 0 V or the maximal voltage of the pulses. When the circuit is not open, as shown in FIG. 2B, the piezoelectric element acts as a low pass filter and therefore influences the signal recorded during excitation. This means that the samples take values that are higher than 0 V and lower than the maximal voltage of the pulses. By counting the samples taking values between 0 V and the maximal voltage, the open circuit state can be robustly distinguished from the not open circuit state.

Figure 3:
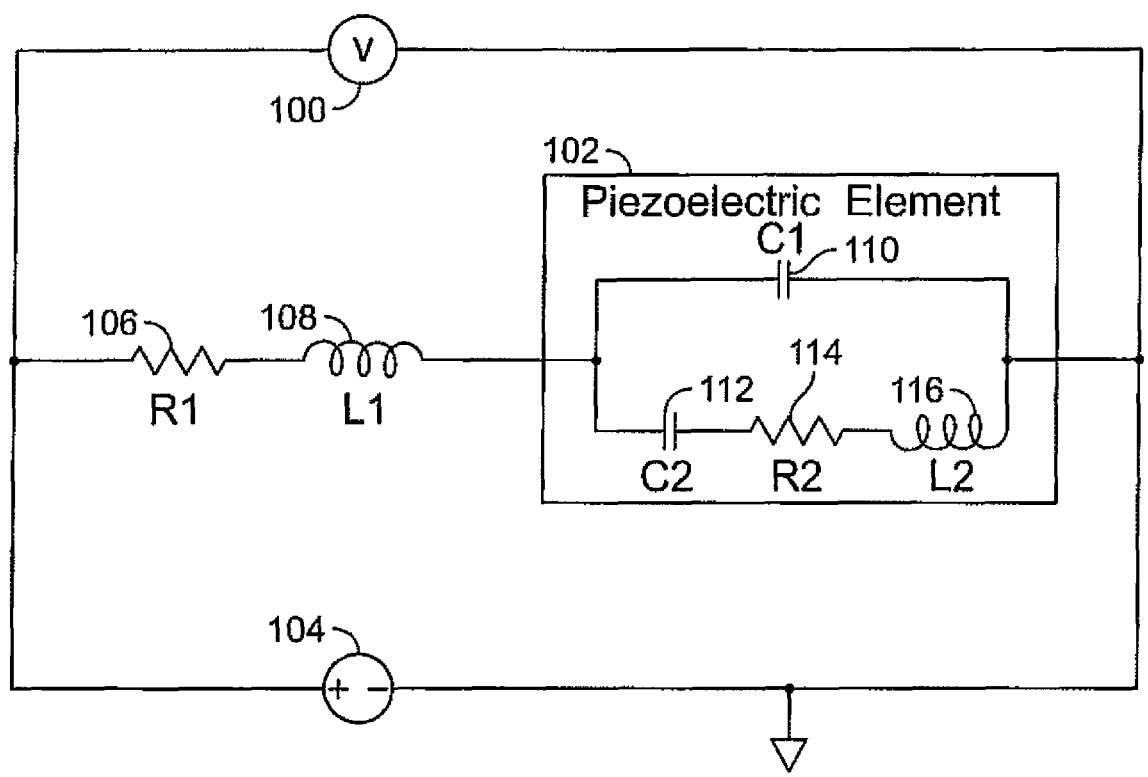
FIG. 3 is a circuit diagram of a testing arrangement according to an embodiment.

According to an embodiment of the present invention, a method is provided for detecting an open circuit state failure in a piezoelectric element connection. The testing apparatus, as shown in FIG. 3, includes a piezoelectric element 102, a resistor 106, an inductor 108, and a voltage source 104 which are connected in series. Using the voltage source 104, also referred to as an exciting unit, the piezoelectric element 102 can be excited with an electrical excitation signal from the voltage source 104. Moreover, a voltmeter 100 is connected in parallel with the piezoelectric element 102, the resistor 106, and the inductor 108. Using this voltmeter 100, also referred to as a monitoring and evaluation unit, the electrical output signal generated by the piezoelectric element 102 in response to the excitation signal can be measured; monitored and evaluated. In an embodiment, the electrical output signal is a voltage signal. The monitoring and evaluating unit is active only when the exciting unit is active; the electrical output signal is monitored only during excitation. FIG. 3 shows the testing apparatus in terms of an electrical circuit.

The testing apparatus with the piezoelectric element 102 can be integrated in an electronic device, wherein the electronic device triggers a test run of the testing apparatus, e.g. when the device is booting, to make sure that the piezoelectric element 102 is working properly.

Figure 4:
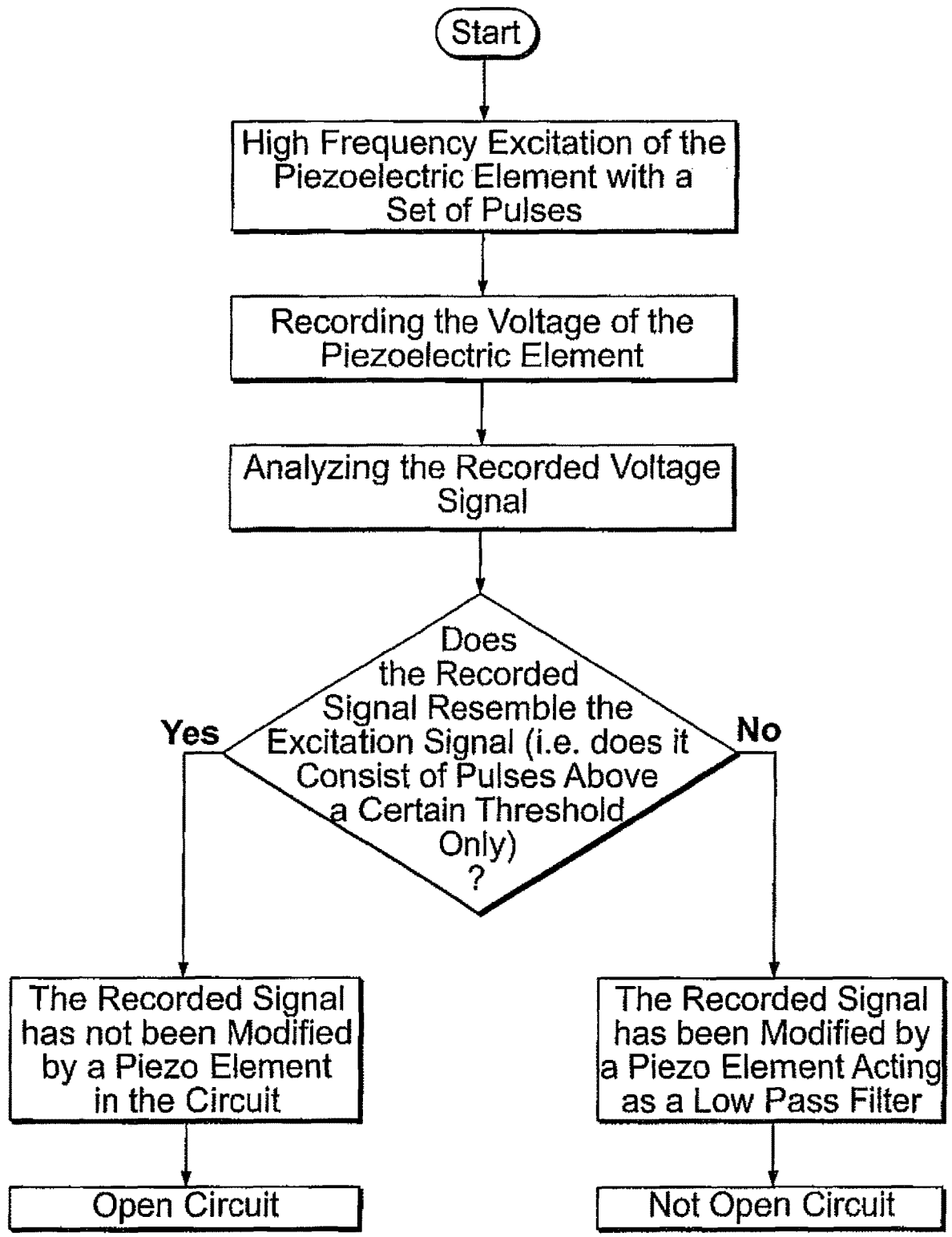
FIG. 4 is a flowchart of a testing method according to an embodiment.

The testing method according to the first embodiment is sketched in FIG. 4 as a flow chart. For testing whether or not there is an open circuit state failure, the piezoelectric element 102 is excited with an electrical excitation signal. The excitation signal is a pulse train. By definition, the pulse train consists of two values only, namely a minimum value Vmin (usually 0 V) and a maximum value Vmax. This means that the excitation signal only takes values in the vicinity of the minimum value [Vmin, Vmin+$\varepsilon$] and in the vicinity of the maximum value [Vmax-$\varepsilon$, Vmax], where $\varepsilon$ is the smallest nonnegative real number for which the excitation signal only takes values within the intervals [Vmin, Vmin+$\varepsilon$] or [Vmax-$\varepsilon$, Vmax]. The constant $\varepsilon$ is introduced to make sure that the excitation signal does not take any value within the interval [Vmin+$\varepsilon$, Vmax-$\varepsilon$], even if a measurement inaccuracy occurs. This is an important characteristic which will help distinguish between an open circuit state and a not open circuit state.

The frequency of the excitation signal is chosen well above the resonance frequency of the piezoelectric element 102. Specifically, the frequency is chosen high enough such that the piezoelectric element 102 cannot follow the excitation signal anymore and therefore acts as a low pass filter. This means that if the piezoelectric element 102 is functional, it modifies the excitation signal such that the output signal significantly differs from the excitation signal. In contrast, when there is an open circuit failure, the piezoelectric element 102 has no influence on the excitation signal and hence the output signal resembles the excitation signal. This characteristic will help distinguish between an open circuit state and a not open circuit state.

Generally, the frequency of the pulse train and the constants Vmin, Vmax and $\varepsilon$ are determined empirically in a number of test runs such that the above requirements are met. Thereby, the test runs are repeated until the probability, that a value for the frequency of the pulse train and the constants Vmin, Vmax and $\varepsilon$ occurs which is more extreme than the corresponding values from all previous runs, is smaller than a predefined value, e.g. $p \leq 0.01$.

Previous methods for detecting open circuit states recorded the output signal both during the excitation and during the following ringdown for further analysis. The disadvantage of this method is that environmental effects such as the propagation in a medium (e.g. liquid or air) or temperature influence the output signal during the ringdown and therefore distort the comparison of excitation and output signal. To avoid such effects, the present embodiment records the output signal, as shown in FIG. 4, only during the excitation without including the ringdown.

When the recording of the output signal is finished, the recorded output signal must be analyzed in order to tell whether or not there is an open circuit state failure in the piezoelectric element connection, as shown in FIG. 4. FIG. 2A shows an example of an output signal as it would occur when there is an open circuit state and FIG. 2B shows an example of an output signal as it would occur when there is a not open circuit state.

Figure 5A:
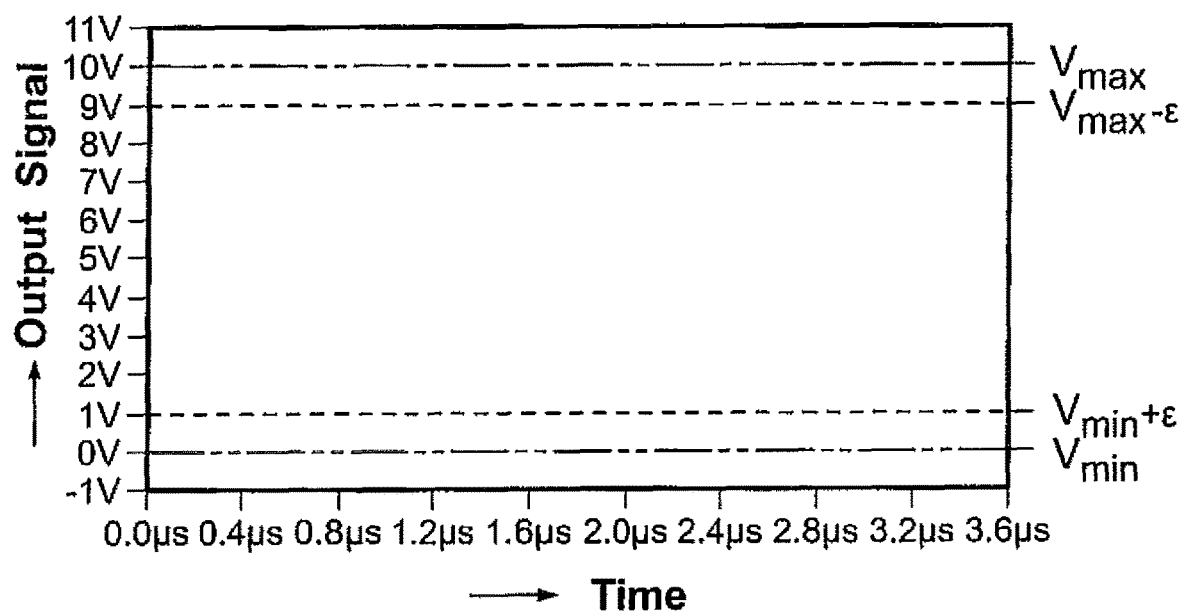
FIG. 5A is a graph of a recorded voltage signal according to an embodiment with an open circuit piezoelectric apparatus.

For a better understanding of how the two output signals can be distinguished from each other, we look at FIG. 5A where the connection lines between adjacent samples are omitted; in FIG. 5A, the difference between the two signals is obvious, as they are either at 0V or 10V. In case of an open circuit state as shown in FIG. 5A, the excitation signal is not modified by the piezoelectric element 102 and therefore the output signal resembles the excitation signal. By definition of Vmin, Vmax and $\varepsilon$, the excitation signal only takes values in the intervals [Vmin, Vmin+$\varepsilon$] or [Vmax-$\varepsilon$, Vmax]. Since the output signal resembles the excitation signal, this holds true for the output signal as well.

Figure 5B:
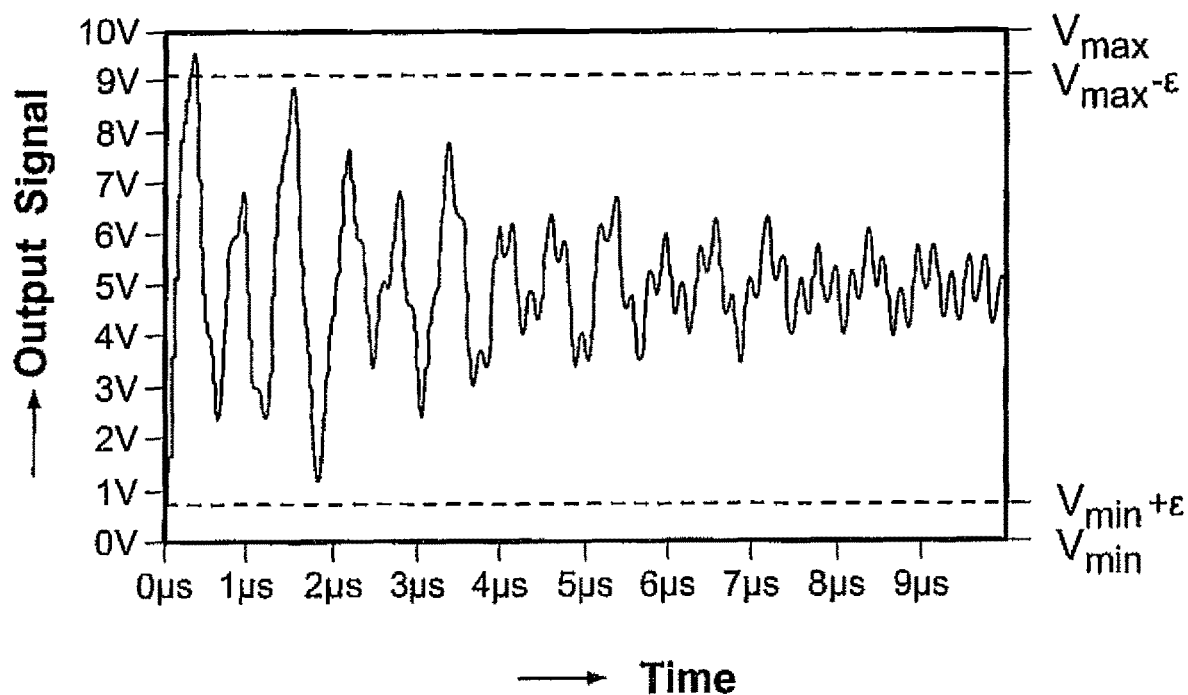
FIG. 5B is a graph of a recorded voltage signal according to an embodiment with a not open circuit piezoelectric apparatus.

In case of a not open circuit state, as shown in FIG. 5B, the excitation signal is modified by the piezoelectric element 102, the resistor 106 and the inductor 108 which are connected in series. The signal is dampened by the resistor 106 and the inductor 108, and it is low pass filtered by the piezoelectric element 102. Therefore, the output signal has a lower amplitude and a different shape compared to the excitation signal. This characteristic can be used for differentiating between the open circuit and the not open circuit state. When the output signal contains a significant number of samples with values in the interval [Vmin+$\varepsilon$, Vmax-$\varepsilon$], then the piezoelectric element connection is considered to be in a not open circuit state. In this embodiment, a necessary and sufficient condition for classifying the piezoelectric element 102 as properly functioning is that the electrical output signal takes a significant number of values outside of a vicinity of the minimum and the maximum value of the excitation signal [Vmin+Vmax-$\varepsilon$].

A second embodiment is equivalent to the first embodiment with one exception: in the first embodiment, the criterion for the circuit state being not open is that the output signal contains a significant number of samples with values in the interval [Vmin+$\varepsilon$, Vmax-$\varepsilon$]. In contrast, in the second embodiment, the criterion for the circuit state being not open is that the samples of the output signal with values bigger than Vmin+$\varepsilon$ have a variance that significantly exceeds the variance of the samples of the excitation signal with values bigger than Vmin+$\varepsilon$. A necessary and sufficient condition for classifying the piezoelectric element 102 as properly functioning in this embodiment is that a variance of all values of the excitation signal higher than Vmin+$\varepsilon$ and the variance of all values of the electrical output signal higher than Vmin+$\varepsilon$ are significantly different.

The level of significance for classifying a piezoelectric element connection as properly functioning is determined empirically such that the number of false positives and false negatives matches the desired robustness.

A third embodiment equals the first embodiment with one exception: in the first embodiment, Vmin, Vmax and $\varepsilon$ are chosen such that Vmin and Vmax are the minimum and the maximum of the excitation signal, respectively, and $\varepsilon$ is the smallest number for which the excitation signal only takes values within the intervals [Vmin, Vmin+$\varepsilon$] or [Vmax-$\varepsilon$, Vmax].

In contrast, in the third embodiment the constant $\varepsilon$ is defined as the smallest number for which another output signal, that has been recorded in a calibrating step in a pre-test with the piezoelectric element 102 removed from the test circuit, only takes values within the intervals [Vmin, Vmin+$\varepsilon$] or [Vmax-$\varepsilon$, Vmax], where Vmin and Vmax are the minimum and the maximum value of the another output signal, respectively.

The advantage of using the output signal of the test circuit with an open circuit state to define Vmin, Vmax and ε is that the pathway of the output signal is similar to the pathway of the output signal of the not open circuit state, whereas the excitation signal is directly available without passing through a pathway.

What is claimed is:

1. A method for detecting an open circuit state failure in a piezoelectric element connection, comprising:
    exciting a piezoelectric element with an excitation signal, the excitation signal is a pulse train, a frequency of the pulse train is chosen such that the piezoelectric element acts as a low pass filter; and
    monitoring and evaluating an electrical output signal generated by the piezoelectric element in response to the excitation signal.

2. The method of claim 1, wherein the electrical output signal is a voltage signal.

3. The method of claim 1, wherein the electrical output signal is monitored only during excitation.

4. The method of claim 3, wherein a constant ε is defined as a smallest number for which the excitation signal only takes values within a pair of intervals [Vmin, Vmin+ε] and [Vmax−ε, Vmax], where Vmin and Vmax are a minimum and a maximum value of the excitation signal, respectively.

5. The method of claim 3, further comprising recording another output signal with the piezoelectric element removed from a test circuit in a calibrating step.

6. The method of claim 5, wherein a constant ε is defined as a smallest number for which the another output signal only takes values within a pair of intervals [Vmin, Vmin+ε] and [Vmax−ε, Vmax], where Vmin and Vmax are a minimum and a maximum value of the another output signal, respectively.

7. The method of claim 4, wherein the frequency of the pulse train and the constants Vmin, Vmax, and ε are determined empirically in a number of test runs.

8. The method of claim 7, wherein the test runs are repeated until a probability that a value for the frequency of the pulse train and the constants Vmin, Vmax and ε occurs which is more extreme than the corresponding values from all previous runs, is smaller than a predefined value.

9. The method of claim 1, wherein the monitoring and evaluating of the electrical output signal includes comparing the electrical output signal with a plurality of characteristics indicative of an electrical signal generated by a properly functioning piezoelectric element.

10. The method of claim 4, wherein a necessary and sufficient condition for classifying the piezoelectric element connection as properly functioning is that the electrical output signal takes a significant number of values outside of a vicinity of the minimum and the maximum value of the excitation signal [Vmin+ε, Vmax−ε].

11. The method of claim 4, wherein a necessary and sufficient condition for classifying the piezoelectric element connection as properly functioning is that a variance of all values of the excitation signal higher than Vmin+ε and the variance of all values of the electrical output signal higher than Vmin+ε are significantly different.

12. The method of claim 1, wherein a level of significance for classifying the piezoelectric element connection as properly functioning is determined empirically such that a number of false positives and false negatives matches a desired robustness.

13. A testing apparatus for detecting an open circuit state failure in a piezoelectric element connection, comprising:
    an exciting unit connected to a piezoelectric element to be tested and operable to excite the piezoelectric element with an excitation signal, the excitation signal is a pulse train, a frequency of the pulse train is chosen such that the piezoelectric element acts as a low pass filter; and
    a monitoring and evaluating unit monitoring and evaluating an electrical output signal generated by the piezoelectric element in response to the excitation signal.

14. The testing apparatus of claim 13, wherein the monitoring and evaluating unit is active only when the exciting unit is active.

15. The testing apparatus of claim 13, wherein the testing apparatus is integrated in an electronic device.

16. The testing apparatus of claim 15, wherein the electronic device triggers a test run of the testing apparatus.

* * * * *